United States Patent
Kido et al.

(10) Patent No.: US 11,273,498 B2
(45) Date of Patent: Mar. 15, 2022

(54) CUTTING TOOL

(71) Applicant: SUMITOMO ELECTRIC HARDMETAL CORP., Itami (JP)

(72) Inventors: Yasuki Kido, Itami (JP); Susumu Okuno, Itami (JP); Fumiyoshi Kobayashi, Itami (JP); Masahito Hikiji, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 0 days.

(21) Appl. No.: 17/259,198

(22) PCT Filed: Jun. 4, 2020

(86) PCT No.: PCT/JP2020/022119
§ 371 (c)(1),
(2) Date: Jan. 11, 2021

(65) Prior Publication Data
US 2021/0379671 A1   Dec. 9, 2021

(51) Int. Cl.
| | |
|---|---|
| *B23B 27/14* | (2006.01) |
| *C23C 16/02* | (2006.01) |
| *C23C 16/36* | (2006.01) |
| *C23C 16/40* | (2006.01) |
| *C23C 16/34* | (2006.01) |

(52) U.S. Cl.
CPC ........ *B23B 27/148* (2013.01); *C23C 16/0272* (2013.01); *C23C 16/34* (2013.01); *C23C 16/36* (2013.01); *C23C 16/403* (2013.01); *B23B 2224/04* (2013.01); *B23B 2224/24* (2013.01); *B23B 2224/32* (2013.01); *B23B 2228/105* (2013.01)

(58) Field of Classification Search
CPC ... B23B 27/14; B23B 27/148; B23B 2224/04; B23B 2224/24; B23B 2224/32; B23B 2228/105; C23C 16/34; C23C 16/403
USPC ................ 428/336, 697, 698, 699, 701, 702
See application file for complete search history.

(56) References Cited

U.S. PATENT DOCUMENTS 5,871,850 A * 2/1999 Moriguchi .............. C23C 28/04
                                                    428/651
9,534,292 B2 * 1/2017 Fukunaga ............... C23C 16/34
(Continued)

FOREIGN PATENT DOCUMENTS

JP   2011-252204 A   12/2011
JP   2012-196726   * 10/2012
(Continued)

OTHER PUBLICATIONS

Von Fieandt et al "On the growth, orienatation and hardness of chemical vapor deposited Ti(C,N)" Thin Solid Films 645 p. 19-26 (Year: 2018).*

(Continued)

*Primary Examiner* — Archene A Turner
(74) *Attorney, Agent, or Firm* — Xsensus LLP

(57) ABSTRACT

A cutting tool includes: a substrate; a hard layer provided on the substrate; and a titanium carbonitride layer provided on the hard layer, wherein a thickness of the titanium carbonitride layer is more than or equal to 2 μm, a hardness of the titanium carbonitride layer at a room temperature is more than or equal to 35 GPa, and a Young's modulus of the titanium carbonitride layer at the room temperature is more than or equal to 800 GPa.

6 Claims, 4 Drawing Sheets

(56) References Cited

U.S. PATENT DOCUMENTS

| | | | |
|---|---|---|---|
| 2003/0211366 A1* | 11/2003 | Ruppi | C23C 16/308 |
| | | | 428/698 |
| 2013/0152481 A1* | 6/2013 | Paseuth | C23C 16/36 |
| | | | 51/307 |
| 2017/0275765 A1* | 9/2017 | Stiens | C23C 16/34 |
| 2019/0160547 A1 | 5/2019 | Takahashi et al. | |

FOREIGN PATENT DOCUMENTS

| | | |
|---|---|---|
| JP | 2017-159409 A | 9/2017 |
| JP | 2019-98430 A | 6/2019 |

OTHER PUBLICATIONS

Written Opinion of the International Searching Authority, from International Application PCT/JP2020/022119 dated Sep. 1, 2020 with English translation, 6 pages.

* cited by examiner

CUTTING TOOL

CROSS-REFERENCE TO RELATED APPLICATION

The present application is based on PCT filing PCT/JP2020/022119, filed Jun. 4, 2020, the entire contents of which are incorporated herein by reference.

TECHNICAL FIELD

The present disclosure relates to a cutting tool.

BACKGROUND ART

Conventionally, a cutting tool having a substrate coated with a coating film has been used. For example, Japanese Patent Laying-Open No. 2019-098430 (PTL 1) discloses a coated cutting tool comprising a substrate and a coating layer formed on a surface of the substrate, wherein: the coating layer comprises a lower layer including at least one Ti compound layer containing a Ti compound of Ti and an element of at least one kind selected from the group consisting of C, N, O and B, an intermediate layer including an α-type $Al_2O_3$ layer containing α-type $Al_2O_3$, and an upper layer including a TiCN layer containing TiCN; the respective layers are laminated in this order from the substrate side toward a surface side of the coating layer; an average thickness of the coating layer is from 5.0 μm or more to 30.0 μm or less; as to a cross-sectional surface which is located within 1 μm below a surface of the intermediate layer toward the substrate and is parallel to the surface of the substrate, a misorientation A satisfies a condition represented by formula (1) (RSA≥40); and as to a cross-sectional surface which is located within 1 μm below a surface of the upper layer toward the substrate and is parallel to the surface of the substrate, a misorientation B satisfies a condition represented by formula (2) (RSB≥40).

CITATION LIST

Patent Literature

PTL 1: Japanese Patent Laying-Open No. 2019-098430

SUMMARY OF INVENTION

A cutting tool according to the present disclosure includes: a substrate; a hard layer provided on the substrate; and a titanium carbonitride layer provided on the hard layer, wherein
a thickness of the titanium carbonitride layer is more than or equal to 2 μm,
a hardness of the titanium carbonitride layer at a room temperature is more than or equal to 35 GPa, and
a Young's modulus of the titanium carbonitride layer at the room temperature is more than or equal to 800 GPa.

DETAILED DESCRIPTION

Figure 1:
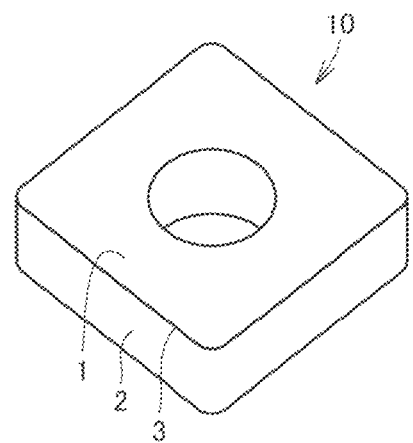
FIG. 1 is a perspective view illustrating one implementation of a substrate of a cutting tool.

Problem to be Solved by the Present Disclosure

In PTL 1, since the coating film having the above-described configuration is included, wear resistance and breakage resistance are expected to be improved to result in a long life of the cutting tool.

In recent years, however, cutting processes have been performed at a higher speed with higher efficiency and loads applied to cutting tools have been increased, with the result that the life of each of the cutting tools tends to become short. Therefore, it has been required to further improve mechanical characteristics (for example, wear resistance, breakage resistance, plastic deformation resistance, and the like) of a coating film of a cutting tool.

The present disclosure has been made in view of the foregoing circumstance and has an object to provide a cutting tool having improved wear resistance and plastic deformation resistance of the mechanical characteristics.

Advantageous Effect of the Present Disclosure

According to the present disclosure, there can be provided a cutting tool having improved wear resistance and plastic deformation resistance.

DESCRIPTION OF EMBODIMENTS

First, embodiments of the present disclosure are listed and described.

[1] A cutting tool according to the present disclosure includes: a substrate; a hard layer provided on the substrate; and a titanium carbonitride layer provided on the hard layer, wherein
a thickness of the titanium carbonitride layer is more than or equal to 2 μm,
a hardness of the titanium carbonitride layer at a room temperature is more than or equal to 35 GPa, and
a Young's modulus of the titanium carbonitride layer at the room temperature is more than or equal to 800 GPa.

Since the cutting tool includes the above-described configuration, wear resistance and plastic deformation resistance are improved. Here, the term "wear resistance" refers to resistance of a titanium carbonitride layer against wear when used for cutting. The term "plastic deformation resistance" refers to resistance of the titanium carbonitride layer against plastic deformation when used for cutting.

[2] The thickness of the titanium carbonitride layer is preferably more than or equal to 2 μm and less than or equal to 4 μm. By defining in this way, the wear resistance is further improved.

[3] The hardness of the titanium carbonitride layer at the room temperature is preferably more than or equal to 35 GPa and less than or equal to 40 GPa. By defining in this way, the wear resistance is further improved.

[4] The Young's modulus of the titanium carbonitride layer at the room temperature is preferably more than or equal to 800 GPa and less than or equal to 950 GPa. By defining in this way, the plastic deformation resistance is further improved.

[5] The hard layer preferably includes aluminum oxide or aluminum titanium nitride. By defining in this way, oxidation resistance is improved in addition to the wear resistance and the plastic deformation resistance.

[6] The cutting tool preferably further includes an underlying layer provided between the substrate and the hard layer. By defining in this way, adhesion between the substrate and the hard layer is improved in addition to the wear resistance and the plastic deformation resistance.

DETAILS OF EMBODIMENTS OF THE PRESENT DISCLOSURE

The following describes one embodiment (hereinafter, referred to as "the present embodiment") of the present disclosure. However, the present embodiment is not limited thereto. In the present specification, the expression "X to Z" represents a range of lower to upper limits (i.e., more than or equal to X and less than or equal to Z). When no unit is indicated for X and a unit is indicated only for Z, the unit of X is the same as the unit of Z. Further, in the present specification, when a compound is expressed by a chemical formula in which a composition ratio of composition elements is not limited such as "TiC", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiC" includes not only a stoichiometric composition "$Ti_1C_1$" but also a non-stoichiometric composition such as "$Ti_1C_{0.8}$". The same also applies to compounds other than the "TiC".

<<Cutting Tool>>

A cutting tool according to the present disclosure includes: a substrate; a hard layer provided on the substrate; and a titanium carbonitride layer provided on the hard layer, wherein a thickness of the titanium carbonitride layer is more than or equal to 2 μm, a hardness of the titanium carbonitride layer at a room temperature is more than or equal to 35 GPa, and a Young's modulus of the titanium carbonitride layer at the room temperature is more than or equal to 800 GPa.

Figure 2:
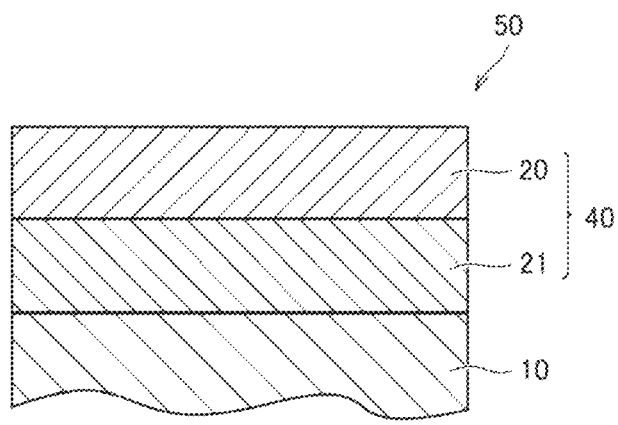
FIG. 2 is a schematic cross sectional view of a cutting tool according to one implementation of the present embodiment.
Figure 3:
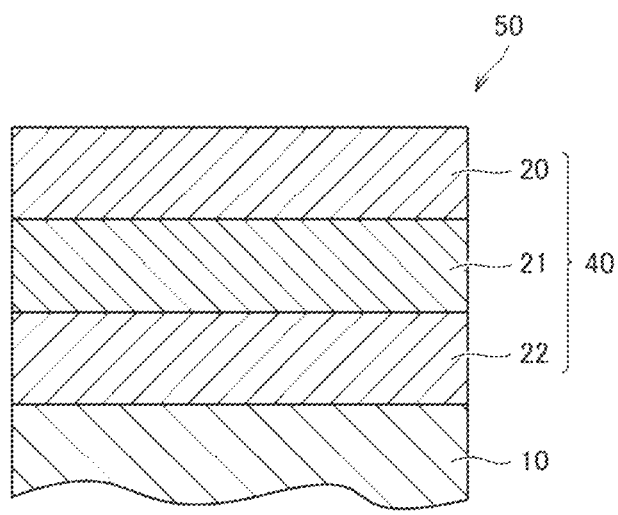
FIG. 3 is a schematic cross sectional view of a cutting tool according to another implementation of the present embodiment.

A cutting tool 50 of the present embodiment includes: a substrate 10; a hard layer 21 provided on substrate 10; and a titanium carbonitride layer 20 provided on hard layer 21 (hereinafter, cutting tool 50 may be also simply referred to as "cutting tool") (FIG. 2). In addition to titanium carbonitride layer 20 and hard layer 21, cutting tool 50 may further include an underlying layer 22 provided between substrate 10 and hard layer 21 (FIG. 3). The other layer(s) such as underlying layer 22 will be described later.

It should be noted that the above-described layers provided on substrate 10 may be collectively referred to as "coating film". That is, cutting tool 50 includes a coating film 40 provided on substrate 10, and coating film 40 includes titanium carbonitride layer 20 and hard layer 21. Coating film 40 may further include underlying layer 22.

Examples of the cutting tool include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

Among these various substrates, it is particularly preferable to select the WC based cemented carbide or the cBN sintered material. This is due to the following reason: each of these substrates is excellent in balance between hardness and strength particularly at a high temperature, and has excellent characteristics as a substrate of a cutting tool for the above-described purpose of use.

When the cemented carbide is used as the substrate, the effects of the present embodiment are achieved even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cBN sintered material, a surface hardening layer may be formed. Even when the surface is thus modified, the effects of the present embodiment are exhibited.

FIG. 1 is a perspective view illustrating one implementation of the substrate of the cutting tool. The substrate having such a shape is used as a substrate of an indexable cutting insert for turning, for example. Substrate 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of substrate 10.

When the cutting tool is an indexable cutting insert, substrate 10 may have a shape having a chip breaker or a shape having no chip breaker. For the shape of cutting edge ridgeline portion 3, any of the following shapes is included: a sharp edge (ridge at which the rake face and the flank face cross each other); a honing (shape obtained by providing a curvature to the sharp edge); a negative land (chamfered shape); and a shape obtained by combining the honing and the negative land.

The shape of substrate 10 and the names of the respective portions have been described with reference to FIG. 1. The same terms as those described above are used for a shape corresponding to substrate 10 and the names of the respective portions in cutting tool 50 according to the present embodiment. That is, the cutting tool has the rake face, the flank face, and the cutting edge ridgeline portion that connects the rake face and the flank face to each other.

<Coating Film>

Coating film 40 according to the present embodiment includes: hard layer 21 provided on substrate 10; and titanium carbonitride layer 20 provided on hard layer 21 (see FIG. 2). The "coating film" has a function of improving various characteristics in the cutting tool such as breakage resistance, wear resistance, and plastic deformation resistance, by coating at least a portion (for example, the rake face or the like to be brought into contact with a workpiece during cutting) of the substrate. The coating film preferably coats the entire surface of the substrate, rather than a portion of the substrate. However, a coating film that does not coat a portion of the substrate and a coating film having a partially different configuration are not deviated from the scope of the present embodiment.

The thickness of the coating film is preferably more than or equal to 2 µm and less than or equal to 30 µm, and is more preferably more than or equal to 3 µm and less than or equal to 25 µm. Here, the thickness of the coating film refers to a total of the respective thicknesses of the layers included in the coating film. Examples of the "layers included in the coating film" include the titanium carbonitride layer, the hard layer, and the underlying layer, which will be described below. The thickness of the coating film can be determined, for example, as follows: a scanning transmission electron microscope (STEM) is used to measure thicknesses at ten arbitrary points in a cross section sample parallel to the normal direction of the surface of the substrate, and the average value of the measured thicknesses at the ten points is determined. The same applies to respective measurements of thicknesses of the titanium carbonitride layer, the hard layer, and the underlying layer, which will be described below. Examples of the scanning transmission electron microscope include JEM-2100F (trademark) provided by JEOL.

(Titanium Carbonitride Layer)

The titanium carbonitride layer in the present embodiment is provided on the hard layer described later. Here, the expression "provided on the hard layer" is not limited to an embodiment in which the titanium carbonitride layer is provided directly on the hard layer (see FIG. 2), and includes an embodiment in which the titanium carbonitride layer is provided on the hard layer with another layer being interposed therebetween. That is, the titanium carbonitride layer may be provided directly on the hard layer or may be provided on the hard layer with another layer being interposed therebetween, as long as the effects of the present disclosure are exhibited. Another layer such as a surface layer may be provided on the titanium carbonitride layer. Alternatively, the titanium carbonitride layer may represent the outermost surface of the coating film.

The titanium carbonitride layer may be composed of only titanium carbonitride (TiCN), or may be composed of titanium carbonitride and an inevitable impurity. Examples of the inevitable impurity include oxygen, chlorine, and the like.

The thickness of the titanium carbonitride layer is more than or equal to 2 µm, is preferably more than or equal to 2 µm and less than or equal to 4 µm, and is more preferably more than or equal to 2.2 µm and less than or equal to 3.5 µm. Since the thickness of the titanium carbonitride layer is more than or equal to 2 µm, the cutting tool becomes excellent in wear resistance. Since the thickness of the titanium carbonitride layer is less than or equal to 4 µm, the cutting tool becomes excellent in welding resistance in addition to the wear resistance. The thickness of the titanium carbonitride layer can be checked by observing the vertical cross sections of the substrate and the coating film using the STEM in the same manner as described above.

The hardness of the titanium carbonitride layer at a room temperature is preferably more than or equal to 35 GPa and less than or equal to 40 GPa, and is more preferably more than or equal to 36 GPa and less than or equal to 38 GPa. Since the hardness of the titanium carbonitride layer is more than or equal to 35 GPa, the cutting tool is further excellent in wear resistance. Since the hardness of the titanium carbonitride layer is less than or equal to 40 GPa, the cutting tool is improved in toughness and therefore becomes excellent in breakage resistance.

The Young's modulus of the titanium carbonitride layer at the room temperature is preferably more than or equal to 800 GPa and less than or equal to 950 GPa, and is more preferably more than or equal to 820 GPa and less than or equal to 930 GPa. Since the Young's modulus of the titanium carbonitride layer is more than or equal to 800 GPa, the cutting tool becomes further excellent in plastic deformation resistance. Since the Young's modulus of the titanium carbonitride layer is less than or equal to 950 GPa, the cutting tool is improved in toughness and therefore becomes excellent in breakage resistance.

The hardness and Young's modulus can be determined by a nano-indentation method according to a standard procedure defined in "ISO 14577-1: 2015 Metallic materials—Instrumented indentation test for hardness and materials parameters—". In the present embodiment, the "room temperature" means 25° C. In order to precisely determine the hardness and Young's modulus, the indentation depth of an indenter is set so as not to exceed $1/10$ of the thickness of the titanium carbonitride layer in the indentation direction of the indenter. A pressing load of the indenter is set to 2 g. As a sample, the above-described cross section sample may be used as long as the cross sectional area of the titanium carbonitride layer can be secured to be 10 times as large as the area of the indenter. Alternatively, in order to secure a sufficiently wide cross sectional area of the titanium carbonitride layer with respect to the indenter, a sample having a cross section inclined with respect to the normal direction of the surface of the substrate may be used. Such measurement is performed onto at least ten cross section samples, and the respective average values of the hardnesses and Young's moduli determined for the samples are defined as the hardness and Young's modulus of the titanium carbonitride layer. It should be noted that data considered to apparently indicate an abnormal value is excluded.

(Hard Layer)

The cutting tool includes the hard layer provided on the substrate. Here, the expression "provided on the substrate" is not limited to an embodiment in which the hard layer is provided directly on the substrate (see FIG. 2), and includes an embodiment in which the hard layer is provided on the substrate with another layer being interposed therebetween (see FIG. 3). That is, the hard layer may be provided directly on the substrate or may be provided on the substrate with another layer such as the below-described underlying layer being interposed therebetween, as long as the effects of the present disclosure are exhibited. The hard layer preferably includes aluminum oxide ($Al_2O_3$) or aluminum titanium nitride (AlTiN). The aluminum oxide is preferably α-type aluminum oxide (α-$Al_2O_3$). In one aspect of the present embodiment, the hard layer may be composed of only aluminum oxide, or may be composed of aluminum oxide and an inevitable impurity. The hard layer may be composed of only aluminum titanium nitride, or may be composed of aluminum titanium nitride and an inevitable impurity. Examples of the inevitable impurity include chlorine, sulfur, and the like.

The thickness of the hard layer is preferably more than or equal to 3 µm and less than or equal to 20 µm, and is more preferably more than or equal to 3 µm and less than or equal to 15 μm. The thickness of the hard layer can be checked by observing the vertical cross sections of the substrate and the coating film using the STEM in the same manner as described above.

(Underlying Layer)

The cutting tool preferably further includes underlying layer 22 provided between substrate 10 and hard layer 21 (see FIG. 3). Underlying layer 22 preferably includes TiCN, TiN or TiCNO. When the underlying layer is a TiCN layer, the configuration (composition, thickness, physical property, or the like) of the underlying layer may be the same as or different from that of the titanium carbonitride layer.

The thickness of the underlying layer is preferably more than or equal to 0.1 μm and less than or equal to 15 μm, and is more preferably more than or equal to 0.3 μm and less than or equal to 10 μm. Such a thickness can be checked by observing the vertical cross sections of the substrate and the coating film using the scanning transmission electron microscope (STEM) or the like in the same manner as described above.

(Surface Layer)

In the cutting tool, the surface layer may be further provided on the titanium carbonitride layer. The surface layer preferably includes a compound composed of a titanium element and at least one element selected from a group consisting of C, N and B.

Examples of the compound included in the surface layer include TiC, TiN, TiCN and $TiB_2$. When the surface layer is a TiCN layer, the configuration (composition, thickness, physical property, or the like) of the surface layer may be the same as that of the titanium carbonitride layer as long as the surface layer can be distinguished from the titanium carbonitride layer, or may be different from that of the titanium carbonitride layer.

The thickness of the surface layer is preferably more than or equal to 0.1 μm and less than or equal to 3 μm, and is more preferably more than or equal to 0.3 μm and less than or equal to 1.5 μm. Such a thickness can be checked by observing the vertical cross sections of the substrate and the coating film using the scanning transmission electron microscope (STEM) or the like in the same manner as described above.

(Other Layer(s))

As long as the effects exhibited by the cutting tool according to the present embodiment are not compromised, the coating film may further include other layer(s). Each of the other layer(s) may have a composition different from or the same as that of the titanium carbonitride layer, the hard layer, the underlying layer, or the surface layer. Examples of a compound included in the other layer(s) include TiN, TiCN, TiBN, AlTiN, $Al_2O_3$, and the like. It should be noted that an order of layering the other layer(s) is particularly not limited. The thickness of each of the other layer(s) is not particularly limited as long as the effects of the present embodiment are not compromised. For example, the thickness of each of the other layer(s) is more than or equal to 0.1 μm and less than or equal to 20 μm.

<<Method of Producing Cutting Tool>>

A method of producing a cutting tool according to the present embodiment includes:

a step of preparing the substrate (hereinafter, also simply referred to as "first step");

a step of forming the hard layer on the substrate by a chemical vapor deposition method (hereinafter, also simply referred to as "second step"); and a step of forming the titanium carbonitride layer on the hard layer by the chemical vapor deposition method (hereinafter, also simply referred to as "third step").

Hereinafter, the first to third steps will be described.

<First Step: Step of Preparing Substrate>

In the first step, the substrate is prepared. For example, a cemented carbide substrate is prepared as the substrate. For the cemented carbide substrate, a commercially available cemented carbide substrate may be used or a cemented carbide substrate may be produced using a general powder metallurgy method. In the production using the general powder metallurgy method, for example, WC powder, Co powder, and the like are mixed using a ball mill or the like to obtain a powder mixture. This powder mixture is dried and then is formed into a predetermined shape, thereby obtaining a shaped body. Further, by sintering the shaped body, a WC—Co based cemented carbide (sintered material) is obtained. Next, this sintered material is subjected to a predetermined cutting edge process such as honing, thereby producing a substrate composed of the WC—Co based cemented carbide. In the first step, any conventionally known substrate other than the above-described substrate can be prepared.

<Chemical Vapor Deposition Apparatus>

Figure 4:
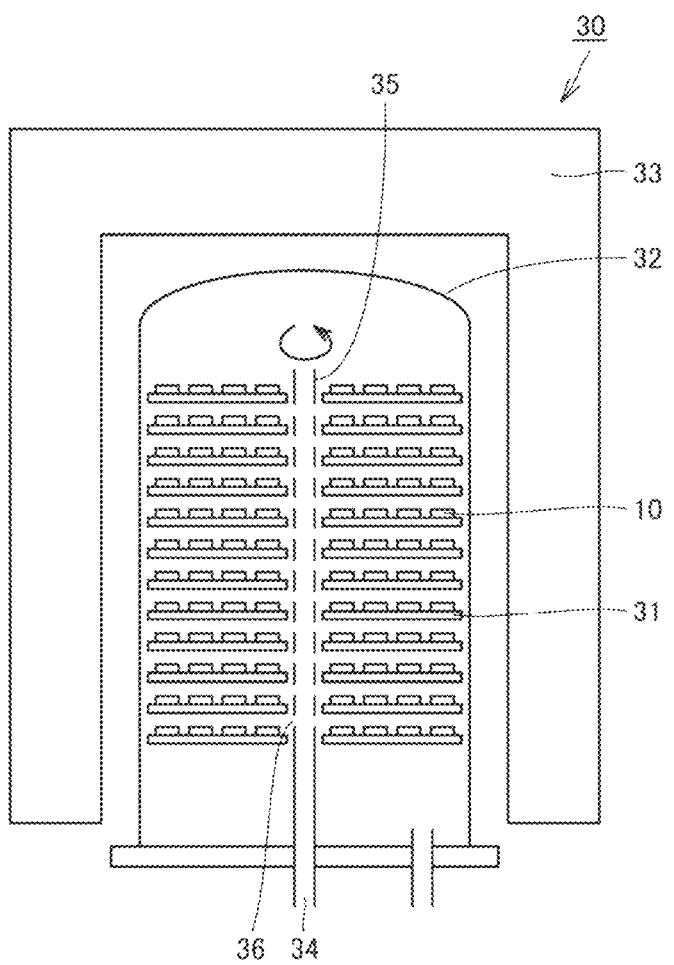
FIG. 4 is a schematic cross sectional view showing an exemplary chemical vapor deposition apparatus used to produce a coating film.

FIG. 4 is a schematic cross sectional view showing an exemplary chemical vapor deposition apparatus (CVD apparatus) used to produce the coating film. Hereinafter, the second step and the third step will be described with reference to FIG. 4. A CVD apparatus 30 includes: a plurality of substrate setting jigs 31 for holding substrates 10; and a reaction container 32 that is composed of a heat-resistant alloy steel and that covers substrate setting jigs 31. Moreover, a temperature adjustment apparatus 33 for controlling a temperature in reaction container 32 is provided to surround reaction container 32. Reaction container 32 is provided with a gas introduction pipe 35 having a gas introduction port 34. Gas introduction pipe 35 extends in the vertical direction in an inner space of reaction container 32 in which substrate setting jigs 31 are disposed, and is disposed to be rotatable with respect to the vertical direction. Gas introduction pipe 35 is provided with a plurality of jetting holes 36 for jetting gas into reaction container 32. By using CVD apparatus 30, the titanium carbonitride layer, the hard layer, and the like included in the coating film can be formed as follows.

First, substrates 10 are placed on substrate setting jigs 31, and a source material gas for the hard layer is introduced into reaction container 32 through gas introduction pipe 35 while controlling the temperature and pressure in reaction container 32 to fall within respective predetermined ranges. Thus, hard layer 21 is formed on substrate 10. Next, a source material gas for the titanium carbonitride layer is introduced into reaction container 32 through gas introduction pipe 35. Thus, titanium carbonitride layer 20 is formed on hard layer 21. Here, underlying layer 22 may be formed on the surface of substrate 10 by introducing a source material gas for the underlying layer into reaction container 32 through gas introduction pipe 35 before forming hard layer 21.

<Second Step: Step of Forming Hard Layer on Substrate>

In the second step, the hard layer is formed on the substrate by the CVD method.

The source material gas for the hard layer is not particularly limited, and a known source material gas may be used. For example, when an aluminum oxide layer is formed as the hard layer, a mixed gas of $AlCl_3$, $CO_2$, $H_2S$ and HCl is used as the source material gas.

The content of $AlCl_3$ in the source material gas is preferably 0.5 to 6 volume %, is more preferably 1 to 5 volume %, and is further preferably 2 to 4 volume %. A preferable flow rate of $AlCl_3$ is 0.75 to 3.5 L/min.

The content of $CO_2$ in the source material gas is preferably 0.3 to 3 volume %, is more preferably 0.4 to 2.5 volume %, and is further preferably 0.5 to 2 volume %. A preferable flow rate of $CO_2$ is 0.25 to 2 L/min.

The content of $H_2S$ in the source material gas is preferably 0.02 to 2 volume %, is more preferably 0.04 to 1.8 volume %, and is further preferably 0.05 to 1.5 volume %. A preferable flow rate of $H_2S$ is 0.5 to 5 L/min.

The content of HCl in the source material gas is preferably 0.5 to 6 volume %, is more preferably 0.7 to 5.5 volume %, and is further preferably 1 to 5 volume %. A preferable flow rate of HCl is 0.5 to 5 L/min. A more preferable flow rate of HCl is 1 to 5 L/min.

The temperature in reaction container 32 is preferably controlled to be 950 to 1000° C. The pressure in reaction container 32 is preferably controlled to be 50 to 200 hPa. As a carrier gas, $H_2$ can be used. When introducing the gases, gas introduction pipe 35 is preferably rotated by a driving unit (not shown). Thus, the gases can be uniformly distributed in reaction container 32.

For example, when forming an aluminum titanium nitride layer as the hard layer, a mixed gas of $AlCl_3$, $TiCl_4$, and $NH_3$ is used as the source material gas.

The content of $AlCl_3$ in the source material gas is preferably 0.5 to 6 volume %, is more preferably 1 to 5 volume %, and is further preferably 2 to 4 volume %. A preferable flow rate of $AlCl_3$ is 0.75 to 3.5 L/min.

The content of $TiCl_4$ in the source material gas is preferably 0.3 to 3 volume %, is more preferably 0.4 to 2.5 volume %, and is further preferably 0.5 to 2 volume %. A preferable flow rate of $TiCl_4$ is 0.25 to 2 L/min.

The content of $NH_3$ in the source material gas is preferably 1 to 12 volume %, is more preferably 2 to 10 volume %, and is further preferably 4 to 8 volume %. A preferable flow rate of $NH_3$ is 0.5 to 5 L/min.

The temperature in reaction container 32 is preferably controlled to be 700 to 800° C. The pressure in reaction container 32 is preferably controlled to be 10 to 40 hPa. As a carrier gas, $H_2$ can be used. When introducing the gases, gas introduction pipe 35 is preferably rotated by the driving unit (not shown). Thus, the gases can be uniformly distributed in reaction container 32.

Regarding the above-described production method, the configuration of each layer is changed by controlling each condition of the CVD method. For example, the composition of each layer is determined by the composition of the source material gas introduced into reaction container 32. The thickness of each layer is controlled by an execution time (film formation time).

<Third Step: Step of Forming Titanium Carbonitride Layer on Hard Layer>

In the third step, the titanium carbonitride layer is formed on the hard layer.

As a source material gas for the titanium carbonitride layer, a mixed gas of $TiCl_4$, $CH_3CN$, $C_2H_4$, $NH_3$ and $N_2$ is used, for example.

The content of $TiCl_4$ in the source material gas is preferably 0.8 to 3 volume %, is more preferably 1 to 2.7 volume %, and is further preferably 1.5 to 2.5 volume %. A preferable flow rate of $TiCl_4$ is 1 to 2.5 L/min.

The content of $CH_3CN$ in the source material gas is preferably 0.2 to 1.5 volume %, is more preferably 0.3 to 1.2 volume %, and is further preferably 0.5 to 1 volume %. A preferable flow rate of $CH_3CN$ is 0.5 to 2 L/min.

The content of $C_2H_4$ in the source material gas is preferably 0.1 to 0.8 volume %, and is more preferably 0.2 to 0.6 volume %. A preferable flow rate of $C_2H_4$ is 0.2 to 1 L/min.

The content of $NH_3$ in the source material gas is preferably 0.1 to 1 volume %, and is more preferably 0.2 to 0.5 volume %. A preferable flow rate of $NH_3$ is 0.2 to 1 L/min.

The content of $N_2$ in the source material gas is preferably 10 to 30 volume %, is more preferably 15 to 28 volume %, and is further preferably 17 to 25 volume %. A preferable flow rate of $N_2$ is 10 to 25 L/min.

The temperature in reaction container 32 is preferably controlled to be 950 to 1000° C. The pressure in reaction container 32 is preferably controlled to be 5 to 50 hPa. As a carrier gas, $H_2$ can be used. It should be noted that when introducing the gases, gas introduction pipe 35 is preferably rotated as described above.

<Other Step(s)>

In the production method according to the present embodiment, in addition to the above-described steps, additional step(s) may be appropriately performed as long as the effects of the present embodiment are not compromised. Examples of the additional step(s) include: a step of forming a surface layer on the titanium carbonitride layer; a step of blasting the coating film; and the like. A method of forming the surface layer is not particularly limited. Examples thereof include a method of forming the surface layer by the CVD method or the like.

The above description includes features additionally described below.

(Clause 1)

A cutting tool comprising: a substrate; a hard layer provided on the substrate; and a titanium carbonitride layer provided on the hard layer, wherein a thickness of the titanium carbonitride layer is more than or equal to 2 µm, a hardness of the titanium carbonitride layer at a room temperature is more than or equal to 35 GPa, and a Young's modulus of the titanium carbonitride layer at the room temperature is more than or equal to 800 GPa.

(Clause 2)

The cutting tool according to clause 1, wherein a thickness of the hard layer is more than or equal to 3 µm and less than or equal to 20 µm.

(Clause 3)

The cutting tool according to clause 1 or 2, further comprising an underlying layer provided between the substrate and the hard layer.

(Clause 4)

The cutting tool according to clause 3, wherein a thickness of the underlying layer is more than or equal to 0.1 µm and less than or equal to 15 µm.

EXAMPLES

Hereinafter, the present invention will be described in detail with reference to examples, but the present invention is not limited thereto.

<<Preparation of Cutting Tool>>

<First Step: Step of Preparing Substrate>

As a substrate, a cemented carbide cutting insert (Shape: CNMG120408N-UX; provided by Sumitomo Electric Hard-Metal; JIS B4120 (2013)) having a composition of TaC (2.0 mass %), NbC (1.0 mass %), Co (10.0 mass %) and WC (remainder) (but an inevitable impurity was included) was prepared.

<Step of Forming Underlying Layer on Substrate>

An underlying layer was formed on the prepared substrate using a CVD apparatus. Conditions for forming the underlying layer are indicated below. It should be noted that a value in parentheses subsequent to each gas composition indicates a flow rate (L/min) of each gas. The thickness of the underlying layer and the composition of the underlying layer are shown in Table 1. It should be noted that in Table 1, a portion indicated by a hyphen "-" indicates that no corresponding layer was formed.

(Underlying Layer: Case of TiCN)

Source material gas: $TiCl_4$ (15 L/min), $CH_3CN$ (0.8 L/min), $N_2$ (20 L/min), and $H_2$ (80 L/min)

Pressure: 95 hPa

Temperature: 860° C.

Film formation time: appropriately adjusted to attain a thickness shown in Table 1

(Underlying Layer: Case of TiN)

Source material gas: $TiCl_4$ (3 L/min), $N_2$ (50 L/min), and $H_2$ (50 L/min)

Pressure: 80 hPa

Temperature: 900° C.

Film formation time: appropriately adjusted to attain a thickness shown in Table 1

<Second Step: Step of Forming Hard Layer on Substrate>

A hard layer was formed on the substrate or the substrate having the underlying layer formed thereon, using a CVD apparatus. Then, the process proceeded to the subsequent third step. Conditions for forming the hard layer are indicated below. The thickness of the hard layer and the composition of the hard layer are shown in Table 1.

(Hard Layer: Case of $\alpha\text{-}Al_2O_3$)

Source material gas: $AlCl_3$ (2.1 L/min), $CO_2$ (0.5 L/min), $H_2S$ (0.5 L/min), HCl (2.1 L/min) and $H_2$ (50 L/min)

Pressure: 150 hPa

Temperature: 980° C.

Film formation time: appropriately adjusted to attain a thickness shown in Table 1

(Hard Layer: Case of AlTiN)

Source material gas: $AlCl_3$ (1.8 L/min), $TiCl_4$ (0.4 L/min), $NH_3$ (4.5 L/min), and $H_2$ (50 L/min)

Pressure: 30 hPa

Temperature: 780° C.

Film formation time: appropriately adjusted to attain a thickness shown in Table 1

<Third Step: Step of Forming Titanium Carbonitride Layer on Hard Layer>

A titanium carbonitride layer was formed on the substrate having the hard layer formed thereon, using a CVD apparatus. Conditions for forming the titanium carbonitride layer are indicated below. The thickness of the titanium carbonitride layer and the composition of the titanium carbonitride layer are shown in Table 1.

(Titanium Carbonitride Layers of Samples 1 to 14: TiCN)

Source material gas: $TiCl_4$ (2.0 L/min), $CH_3CN$ (0.8 L/min), $C_2H_4$ (0.2 L/min), $NH_3$ (0.2 L/min), $N_2$ (20 L/min), and $H_2$ (65 L/min)

Pressure: 30 hPa

Temperature: 900° C.

Film formation time: appropriately adjusted to attain a thickness shown in Table 1

(Titanium Carbonitride Layers of Samples 101 to 109: TiCN)

Source material gas: $TiCl_4$ (2.0 L/min), $CH_3CN$ (1.0 L/min), $N_2$ (20 L/min), and $H_2$ (70 L/min)

Pressure: 30 hPa

Temperature: 975° C.

Film formation time: appropriately adjusted to attain a thickness shown in Table 1

TABLE 1

| Sample | Underlying Layer Thickness (μm) | Hard Layer Thickness (μm) | Titanium Carbonitride Layer Thickness (μm) |
| --- | --- | --- | --- |
| 1 | TiCN (4.5) | $\alpha\text{-}Al_2O_3$ (6.7) | TiCN (2.8) |
| 2 | TiCN (4.2) | $\alpha\text{-}Al_2O_3$ (7.5) | TiCN (2.3) |
| 3 | TiCN (5.1) | $\alpha\text{-}Al_2O_3$ (5.5) | TiCN (3.4) |
| 4 | TiCN (4.0) | $\alpha\text{-}Al_2O_3$ (7.5) | TiCN (2.5) |
| 5 | TiCN (5.5) | $\alpha\text{-}Al_2O_3$ (5.7) | TiCN (2.8) |
| 6 | TiCN (4.6) | $\alpha\text{-}Al_2O_3$ (6.8) | TiCN (2.6) |
| 7 | TiCN (4.8) | $\alpha\text{-}Al_2O_3$ (6.2) | TiCN (3.0) |
| 8 | TiCN (4.8) | $\alpha\text{-}Al_2O_3$ (6.1) | TiCN (3.1) |
| 9 | TiCN (4.5) | $\alpha\text{-}Al_2O_3$ (7.5) | TiCN (2.0) |
| 10 | TiCN (4.3) | $\alpha\text{-}Al_2O_3$ (5.9) | TiCN (3.8) |
| 11 | TiN (0.3) | $\alpha\text{-}Al_2O_3$ (10.7) | TiCN (3.0) |
| 12 | — | $\alpha\text{-}Al_2O_3$ (11.6) | TiCN (2.4) |
| 13 | — | AlTiN (6.2) | TiCN (7.8) |
| 14 | TiCN (4.5) | AlTiN (5.8) | TiCN (3.7) |
| 101 | TiCN (4.5) | $\alpha\text{-}Al_2O_3$ (6.7) | TiCN (2.8) |
| 102 | TiCN (4.2) | $\alpha\text{-}Al_2O_3$ (8.3) | TiCN (1.5) |
| 103 | TiCN (5.0) | $\alpha\text{-}Al_2O_3$ (6.0) | TiCN (3.0) |
| 104 | TiCN (5.2) | $\alpha\text{-}Al_2O_3$ (6.3) | TiCN (3.5) |
| 105 | — | $\alpha\text{-}Al_2O_3$ (13.8) | — |
| 106 | TiCN (2.0) | $\alpha\text{-}Al_2O_3$ (12.0) | — |
| 107 | TiCN (5.2) | AlTiN (6.0) | TiCN (2.8) |
| 108 | — | AlTiN (5.8) | — |
| 109 | TiCN (8.4) | AlTiN (5.6) | — |

With the above procedure, cutting tools of samples 1 to 14 and samples 101 to 109 were produced.

<<Evaluations on Characteristics of Cutting Tools>>

By using the cutting tools of the samples produced as described above, characteristics of the cutting tools were evaluated as described below. Here, samples 1 to 14 correspond to examples of the present disclosure, and samples 101 to 109 correspond to comparative examples.

<Measurement of Thickness of Each of Layers Included in Coating Film>

The thickness of each of the layers included in the coating film was determined by using a scanning transmission electron microscope (STEM) (trademark: JEM-2100F provided by JEOL) to measure thicknesses at arbitrary ten points in a cross section sample parallel to the normal direction of the surface of the substrate and by calculating the average value of the measured thicknesses at the ten points. Results thereof are shown in Table 1.

<Hardness and Young's Modulus of Titanium Carbonitride Layer>

The hardness and Young's modulus of the titanium carbonitride layer in each cutting tool were measured by a nano-indentation method according to a standard procedure defined in "ISO 14577-1: 2015 Metallic materials—Instrumented indentation test for hardness and materials parameters—". Here, the indentation depth of an indenter was set to 100 nm. A pressing load of the indenter was set to 2 g. The measurement temperature was a room temperature (25° C.). Further, as each sample, a cross section sample was used which had been mirror-finished to secure a cross sectional area of the titanium carbonitride layer that is 10 times as large as the area of the indenter. As a measurement device, ENT-1100 (trademark) provided by ELIONIX was used. The above measurement was performed onto ten cross section samples, and the respective average values of the hardnesses and Young's moduli determined for the samples were defined as the hardness and Young's modulus of the titanium carbonitride layer. It should be noted that data considered to apparently indicate an abnormal value was excluded. Results thereof are shown in Table 2.

<<Cutting Test>>

(Cutting Evaluation (1): Continuous Processing Test and Evaluation on Plastic Deformation Resistance)

After performing cutting for 15 minutes under below-described cutting conditions using each of the cutting tools of the samples (samples 1 to 14 and samples 101 to 109) produced as described above, a plastic deformation amount of the tip portion of the cutting tool was measured. Results thereof are shown in Table 2. As the plastic deformation amount is smaller, the cutting tool can be evaluated to have a more excellent plastic deformation resistance. The plastic deformation amount was measured by the following procedure. First, the cutting tool was observed from the flank face side using a tool microscope. Next, based on the observed image, a comparator was used to measure an amount (mm) of deformation of the cutting tool due to melting caused by the cutting test from a position at which the tip portion of the nose curvature of the cutting tool had been present before the cutting test.

Test Conditions of Continuous Processing
Workpiece: SK5
Cutting rate: 150 m/min
Feeding rate: 0.5 mm/rev
Depth of cut: 2 mm
Cutting oil: Wet type (Cutting Evaluation (2): Continuous Processing Test and Evaluation on Wear Resistance)

By using each of the cutting tools of the samples (samples 1 to 14 and samples 101 to 109) produced as described above, a cuttable time until a flank wear amount (Vb) reached 0.3 mm was measured under below-described cutting conditions. Results thereof are shown in Table 2. As the cuttable time is longer, the cutting tool can be evaluated to have a more excellent wear resistance.

Test Conditions of Continuous Processing
Workpiece: SCM435 circular bar
Cutting rate: 200 m/min
Feeding rate: 0.2 mm/rev
Depth of cut: 2 mm
Cutting oil: Wet type

TABLE 2

| Sample | Hardness at Room Temperature (GPa) | Young's Modulus at Room Temperature (GPa) | Cutting Evaluation (1) Plastic Deformation Resistance Amount of Plastic Deformation (mm) | Cutting Evaluation (2) Wear Resistance Cuttable Time (min) |
|---|---|---|---|---|
| 1 | 36 | 890 | 0.09 | 45 |
| 2 | 37 | 825 | 0.12 | 50 |
| 3 | 37 | 920 | 0.08 | 50 |
| 4 | 36 | 810 | 0.12 | 45 |
| 5 | 37 | 940 | 0.08 | 50 |
| 6 | 38 | 880 | 0.11 | 50 |
| 7 | 40 | 890 | 0.10 | 40 |
| 8 | 35 | 880 | 0.11 | 40 |
| 9 | 37 | 890 | 0.11 | 45 |
| 10 | 36 | 890 | 0.11 | 45 |
| 11 | 37 | 860 | 0.13 | 40 |
| 12 | 36 | 880 | 0.13 | 40 |
| 13 | 37 | 930 | 0.09 | 37 |
| 14 | 36 | 890 | 0.08 | 38 |
| 101 | 36 | 700 | 0.35 | 20 |
| 102 | 37 | 840 | 0.20 | 25 |
| 103 | 33 | 780 | 0.30 | 30 |
| 104 | 34 | 960 | 0.22 | 20 |
| 105 | —* | — | 0.39 | 10 |
| 106 | — | — | 0.35 | 15 |
| 107 | 32 | 770 | 0.20 | 25 |
| 108 | — | — | 0.32 | 10 |
| 109 | — | — | 0.28 | 23 |

*Not measured because no titanium carbonitride layer was formed on the hard layer.

In view of the results shown in Table 2, each of the cutting tools of samples 1 to 14 (the cutting tools of the examples of the present disclosure) had excellent results in the cutting evaluation (1), i.e., the plastic deformation amount thereof was less than or equal to 0.13 mm. On the other hand, in the cutting evaluation (1), the plastic deformation amount of each of the cutting tools of samples 101 to 109 (the cutting tools of the comparative examples) was more than or equal to 0.20 mm. In view of the above results, it was found that each of the cutting tools of the examples of the present disclosure has a more excellent plastic deformation resistance than that of each of the cutting tools of the comparative examples.

In view of the results shown in Table 2, each of the cutting tools of samples 1 to 14 had excellent results in the cutting evaluation (2), i.e., the cuttable time thereof was more than or equal to 37 minutes. On the other hand, in the cutting evaluation (2), the cuttable time of each of the cutting tools of samples 101 to 109 (the cutting tools of the comparative examples) was less than or equal to 30 minutes. The cutting tool of sample 101 was considered to cause abnormal wear because the Young's modulus of the titanium carbonitride layer was less than 800 GPa at the room temperature. The cutting tool of sample 102 was considered to cause abnormal wear because the thickness of the titanium carbonitride layer was less than 2 μm. Each of the cutting tools of samples 103 and 107 was considered to cause abnormal wear because the hardness and Young's modulus of the titanium carbonitride layer at the room temperature were less than 35 GPa and less than 800 GPa, respectively. In view of these results, it was found that each of the cutting tools of the examples of the present disclosure has a more excellent wear resistance than that of each of the cutting tools of the comparative examples.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: rake face; 2: flank face; 3: cutting edge ridgeline portion; 10: substrate; 20: titanium carbonitride layer; 21: hard layer; 22: underlying layer; 30: CVD apparatus; 31: substrate setting jig; 32: reaction container; 33: temperature adjustment apparatus; 34: gas introduction port; 35: gas introduction pipe; 36: jetting hole; 40: coating film; 50: cutting tool.

The invention claimed is:

1. A cutting tool comprising: a substrate; a hard layer provided on the substrate; and a titanium carbonitride layer provided on the hard layer, wherein
a thickness of the titanium carbonitride layer is more than or equal to 2 μm,
a hardness of the titanium carbonitride layer at a room temperature is more than or equal to 35 GPa, and
a Young's modulus of the titanium carbonitride layer at the room temperature is more than or equal to 800 GPa.

2. The cutting tool according to claim 1, wherein the thickness of the titanium carbonitride layer is more than or equal to 2 μm and less than or equal to 4 μm.

3. The cutting tool according to claim 1, wherein the hardness of the titanium carbonitride layer at the room temperature is more than or equal to 35 GPa and less than or equal to 40 GPa.

4. The cutting tool according to claim 1, wherein the Young's modulus of the titanium carbonitride layer at the room temperature is more than or equal to 800 GPa and less than or equal to 950 GPa.

5. The cutting tool according to claim 1, wherein the hard layer includes aluminum oxide or aluminum titanium nitride.

6. The cutting tool according to claim 1, further comprising an underlying layer provided between the substrate and the hard layer.

* * * * *